US006835673B1

(12) United States Patent
Tai

(10) Patent No.: US 6,835,673 B1
(45) Date of Patent: Dec. 28, 2004

(54) SEMICONDUCTOR IMPEDANCE THERMAL FILM PROCESSING PROCESS

(76) Inventor: Mei-Hui Tai, 11 /F., No. 19, Minho St., Taipei City (TW)

( * ) Notice: Subject to any disclaimer, the term of this patent is extended or adjusted under 35 U.S.C. 154(b) by 0 days.

(21) Appl. No.: 10/833,082

(22) Filed: Apr. 28, 2004

(51) Int. Cl.[7] ........................ H01L 21/31; H01L 21/469
(52) U.S. Cl. ........................ 438/781; 438/763; 438/780
(58) Field of Search ................................ 438/758, 763, 438/780, 781

(56) References Cited

U.S. PATENT DOCUMENTS 6,077,728 A * 6/2000 Yamasaki et al. ........... 438/125
6,162,745 A * 12/2000 Ito et al. ..................... 438/795
6,395,625 B1 * 5/2002 Maa et al. .................. 438/612
6,706,975 B2 * 3/2004 Sumi et al. ................. 174/264
2003/0165781 A1 * 9/2003 Takeda ....................... 430/319
2004/0082179 A1 * 4/2004 Saito et al. ................ 438/696
2004/0161908 A1 * 8/2004 Terui et al. ................ 438/460

* cited by examiner

*Primary Examiner*—Alexander Ghyka
(74) *Attorney, Agent, or Firm*—Rosenberg, Klein & Lee

(57) ABSTRACT

A semiconductor impedance thermal film processing procedure includes the steps of removing stains and suspension particles from a metal conductive medium, forming a first insulator on the metal conductive medium, forming a semiconductor impedance thermal material on the first insulator, printing metal conductor lines on the semiconductor impedance thermal material, and forming a second insulator on the semiconductor impedance thermal material over the metal conductor lines.

8 Claims, 4 Drawing Sheets

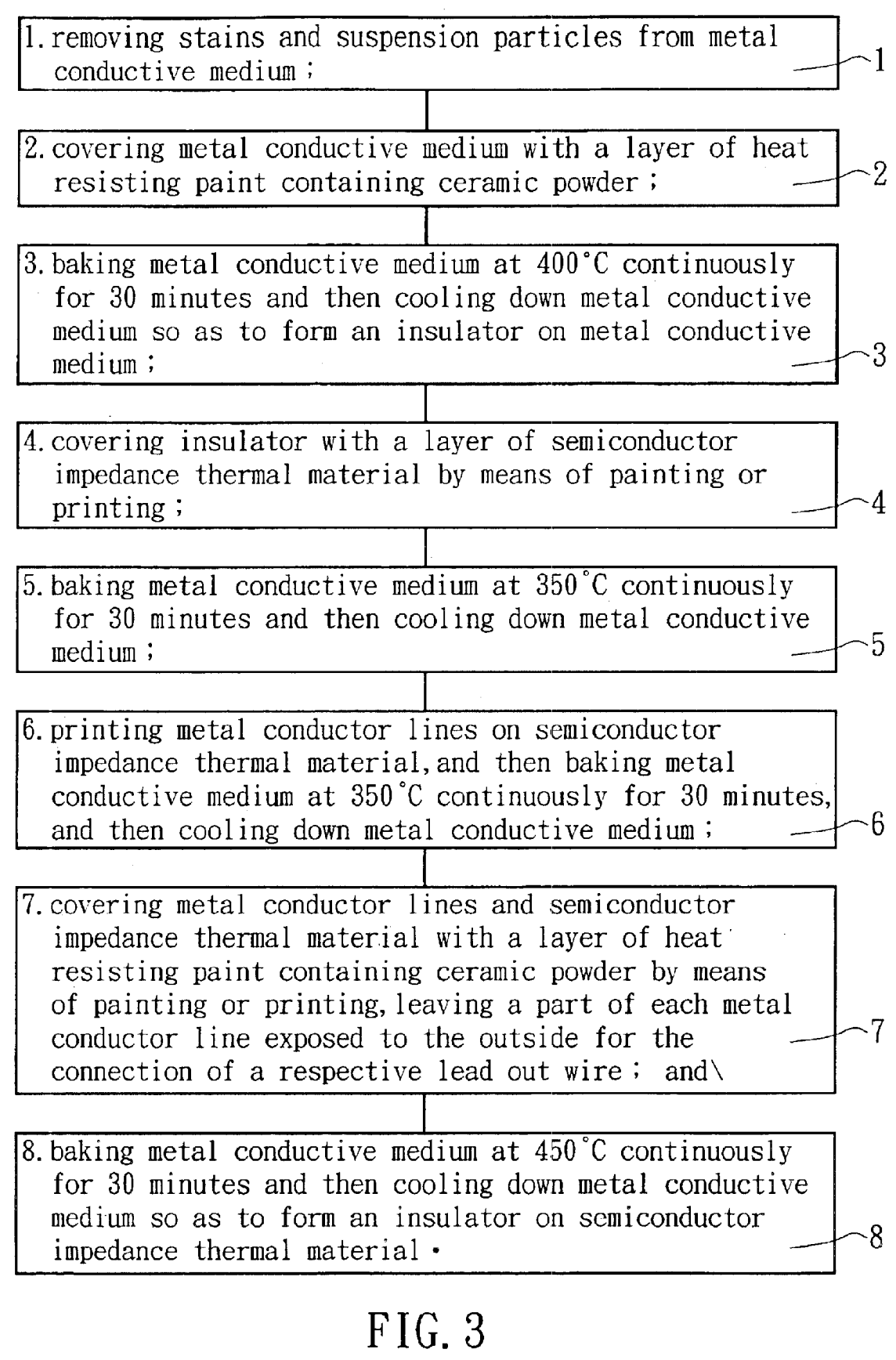

1. removing stains and suspension particles from metal conductive medium ; 1

2. covering metal conductive medium with a layer of heat resisting paint containing ceramic powder ; 2

3. baking metal conductive medium at 400°C continuously for 30 minutes and then cooling down metal conductive medium so as to form an insulator on metal conductive medium ; 3

4. covering insulator with a layer of semiconductor impedance thermal material by means of painting or printing ; 4

5. baking metal conductive medium at 350°C continuously for 30 minutes and then cooling down metal conductive medium ; 5

6. printing metal conductor lines on semiconductor impedance thermal material, and then baking metal conductive medium at 350°C continuously for 30 minutes, and then cooling down metal conductive medium ; 6

7. covering metal conductor lines and semiconductor impedance thermal material with a layer of heat resisting paint containing ceramic powder by means of painting or printing, leaving a part of each metal conductor line exposed to the outside for the connection of a respective lead out wire ; and\ 7

8. baking metal conductive medium at 450°C continuously for 30 minutes and then cooling down metal conductive medium so as to form an insulator on semiconductor impedance thermal material • 8

FIG. 3

SEMICONDUCTOR IMPEDANCE THERMAL FILM PROCESSING PROCESS

BACKGROUND OF THE INVENTION

1. Field of the Invention

The present invention relates to a semiconductor impedance thermal film processing process, which is applicable to the surface of any of a variety of materials.

2. Description of the Related Art

A conventional thermal film processing process is known including the steps of mixing inorganic compound with a water soluble organic solvent to form a conductive paint, covering the prepared conductive paint on the clean surface of a medium by spray-painting or printing, and baking the dielectric material. After baking, thermal film material forms a microscopic conducting network on the surface of the medium.

The aforesaid thermal film processing process has numerous drawbacks as outlined hereinafter.

1. The finished thermal film has a thin thickness for surface transmission of heat energy, resulting in low heating efficiency;

2. The thermal film processing process can only be employed to nonmetal and heat resisting materials such as ceramics and glass. Therefore, the heating efficiency of finished product is low.

3. Due to the limitation to material selection, the thermal film processing process is not applicable to metal media.

SUMMARY OF THE INVENTION

The present invention has been accomplished under the circumstances in view. It is one object of the present invention to provide a semiconductor impedance thermal film processing procedure, which is practical to make a thick semiconductor impedance thermal film that achieves high heating efficiency. It is another object of the present invention to provide a semiconductor impedance thermal film processing procedure, which is practical to make a thick semiconductor impedance thermal film that does not burn oxygen when heating. It is still another object of the present invention to provide a semiconductor impedance thermal film processing procedure, which is practical to make a thick semiconductor impedance thermal film that achieves surface heating evenly. It is still another object of the present invention to provide a semiconductor impedance thermal film processing procedure, which is practical to any of a variety of media. It is still another object of the present invention to provide a semiconductor impedance thermal film processing procedure, which is practical to make a thick semiconductor impedance thermal film that emits far-infrared rays. It is still another object of the present invention to provide a semiconductor impedance thermal film processing procedure, which is practical to make a thick semiconductor impedance thermal film that saves much energy during heating. It is still another object of the present invention to provide a semiconductor impedance thermal film processing procedure, which is practical to make a thick semiconductor impedance thermal film that does not cause the heating medium to change physical characteristics during heating.

To achieve these and other object of the present invention, the semiconductor impedance thermal film processing procedure comprises the steps of: (1) preparing a high conductive metal conductive medium and removing stains and suspension particles from the surface of the metal conductive medium; (2) forming a first insulative layer on the surface of the metal conductive medium; (3) covering a layer of semiconductor impedance thermal material on the first insulative layer; (4) baking the metal conductive medium at 350° C. continuously for 30 minutes and then cooling down the metal conductive medium and then cooling down the metal conductive medium so as to let the layer of semiconductor impedance thermal material be fixedly bonded to the first insulative layer; (5) printing metal conductor lines on the surface of the layer of the semiconductor impedance thermal material, and then baking the metal conductive medium at 350° C. continuously for 30 minutes, and the cooling down the metal conductive medium so as to let the metal conductor lines be fixedly bonded to the layer of semiconductor impedance thermal material; (7) covering the metal conductor lines and the layer of semiconductor impedance thermal material with a layer of heat resisting paint containing ceramic powder by means, leaving a part of each the metal conductor line exposed to the outside for the connection of a respective lead out wire; and (8) baking the metal conductive medium at 450° C. continuously for 30 minutes and then cooling down the metal conductive medium so as to form a second insulative layer on the layer of semiconductor impedance thermal material.

BRIEF DESCRIPTION OF THE DRAWINGS

FIG. 3 is a flow chart of a semiconductor impedance thermal film processing process according to the present invention.

DETAILED DESCRIPTION OF THE PREFERRED EMBODIMENT

Figure 1:
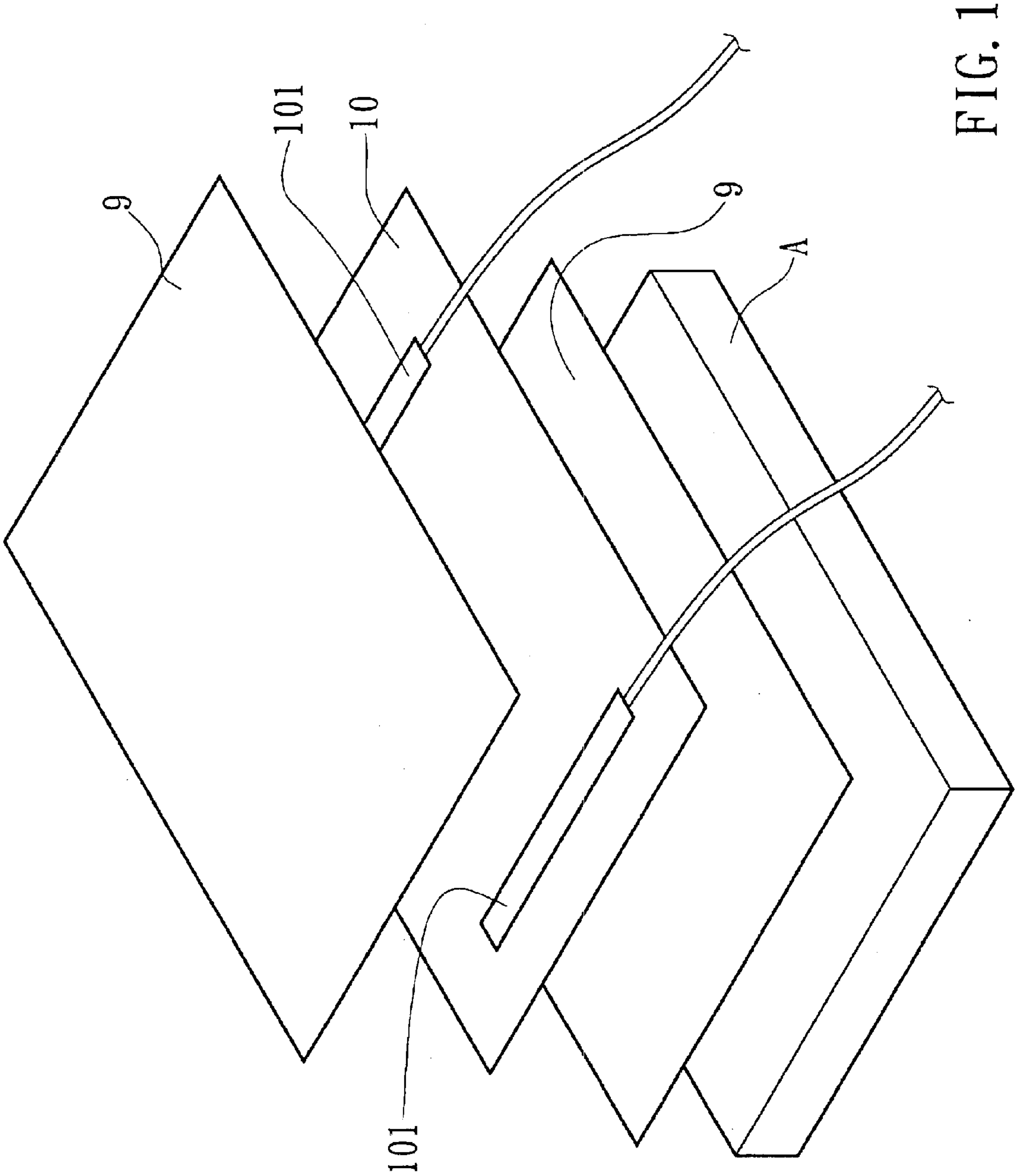
FIG. 1 is an exploded view of a semiconductor impedance thermal film according to the present invention.
Figure 2:
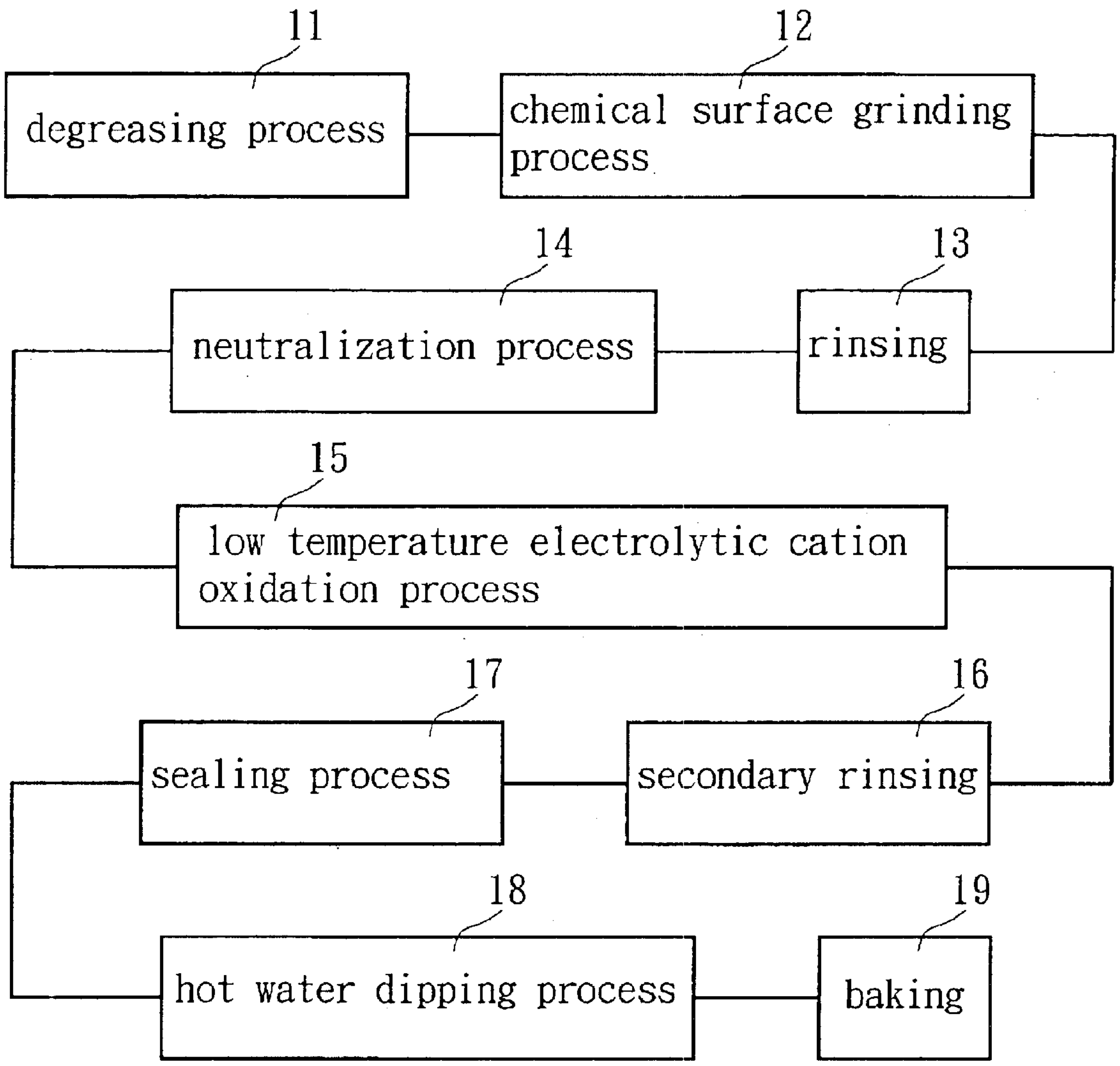
FIG. 2 is a flow chart of a semiconductor impedance thermal film processing procedure according to the present invention.

Referring to FIGS. 1~3, a semiconductor impedance thermal film processing process in accordance with the present invention includes the steps of:

(1) preparing a high conductive metal conductive medium A, for example, aluminum or aluminum alloy, and then washing the surface of the metal conductive medium A to remove stains and suspension particles;

(2) covering the well-washed surface of the metal conductive medium A with a layer of heat resisting paint containing ceramic powder by means of painting or printing;

(3) baking the paint-coated metal conductive medium A at 400° C. continuously for 30 minutes and then cooling down the paint-coated metal conductive medium A so as to form an insulator 9 on the surface of the metal conductive medium A;

(4) covering the insulator 9 at the metal conductive medium A with a layer of semiconductor impedance thermal material 10 by means of painting or printing;

(5) baking the metal conductive medium A at 350° C. continuously for 30 minutes and then cooling down the paint-coated metal conductive medium A so as to let the layer of semiconductor impedance thermal material 10 be fixedly bonded to the insulator 9 at the metal conductive medium A;

(6) printing metal conductor lines 101 on the surface of the layer of semiconductor impedance thermal material 10, and then baking the metal conductive medium A at 350° C. continuously for 30 minutes, and then cooling down the paint-coated metal conductive medium A so as to let the metal conductor lines 101 be fixedly bonded to the layer of semiconductor impedance thermal material 10;

(7) covering the metal conductor lines 101 and the layer of semiconductor impedance thermal material 10 with a layer of heat resisting paint containing ceramic powder by means of painting or printing, leaving a part of each metal conductor line 101 exposed to the outside for the connection of a respective lead out wire; and (8) baking the metal conductive medium A at 450° C. continuously for 30 minutes and then cooling down the metal conductive medium A so as to form an insulator 9 on the layer of semiconductor impedance thermal material 10.

After the aforesaid step (1) preparing a high conductive metal conductive medium A, for example, aluminum or aluminum alloy, and then washing the surface of the metal conductive medium A to remove stains and suspension particles, an oxide-film insulator may be formed on the surface of the metal conductive medium A by means of an oxide-film insulator processing procedure. As illustrated in FIG. 2, the oxide-film insulator processing procedure includes the steps of degreasing process (11), chemical surface grinding process (12), rinsing (13), neutralization process (14), low temperature electrolytic cation oxidation process (15), secondary rinsing (16), sealing process (17), hot water dipping process (18), and baking (19).

Further, the step of washing of the metal conductive medium A to remove stains and suspension particles includes sandblast. The aforesaid low temperature electrolytic cation oxidation process (15) will form an oxide-film on the surface of the metal conductive medium A, which oxide-film is heat resisting and electrically insulative. Therefore, this low temperature electrolytic cation oxidation process (15) may be not necessary. When employed the low temperature electrolytic cation oxidation process (15), it is not necessary to form an insulator 9 on the metal conductive medium A by means of covering a layer of heat resisting paint containing ceramic powder on the metal conductive medium A, and the layer of semiconductor impedance thermal material 10 can be directly coated on the oxide-film that is formed subject to the low temperature electrolytic cation oxidation process (15) (see FIG. 4). Further, when an oxide-film is formed on the metal conductive medium A by means of the low temperature electrolytic cation oxidation process (15), metal conductor lines 101 can be directly printed on the oxide-film. Thereafter, the layer of semiconductor impedance thermal material 10 is covered on the oxide-film and the metal conductor lines 101, and then an insulator 9 is formed on the layer of semiconductor impedance thermal material 10.

Figure 4:
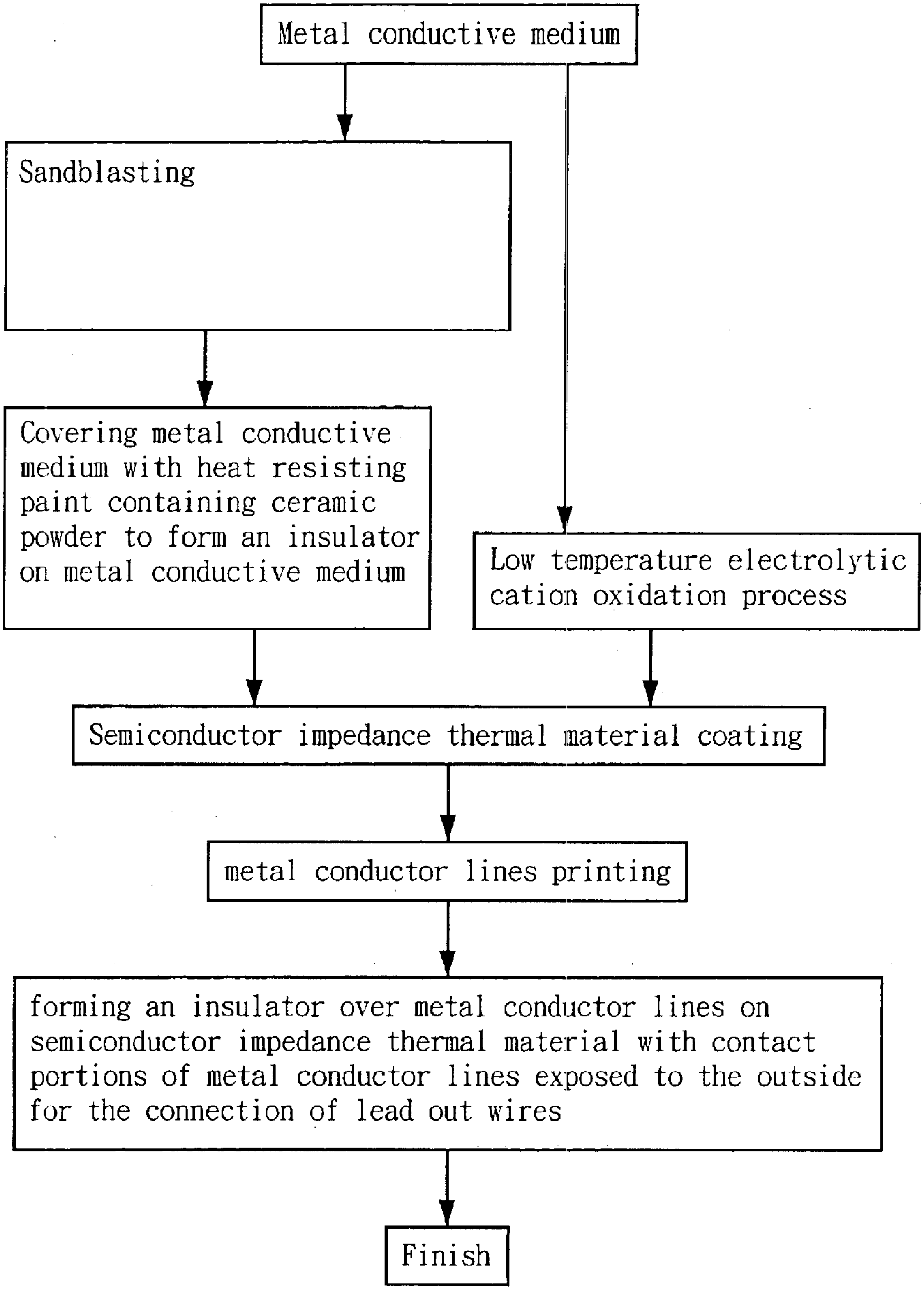
FIG. 4 illustrates two alternate forms of the semiconductor impedance thermal film processing process according to the present invention.

As shown in FIG. 4, the semiconductor impedance thermal film processing process can be performed in either of the following two ways:

1. employing the low temperature electrolytic cation oxidation process (15) to the metal conductive medium A to form an oxide-film on the surface of the metal conductive medium A, and then covering the oxide-film with a layer of semiconductor impedance thermal material 10, and then printing metal conductor lines 101 on the layer of semiconductor impedance thermal material 10, and then forming an insulator 9 over the metal conductor lines 101 on the layer of semiconductor impedance thermal material 10 with contact portions 7 of the metal conductor lines 101 exposed to the outside for the connection of lead out wires.
2. sandblasting the metal conductive medium A to remove stains and suspension particles and then covering the well-washed surface of the metal conductive medium A with a layer of heat resisting paint containing ceramic powder by means of painting or printing so as to form an insulator 9 on the surface of the metal conductive medium A, and then and then covering the oxide-film with a layer of semiconductor impedance thermal material 10, and then printing metal conductor lines 101 on the layer of semiconductor impedance thermal material 10, and then forming an insulator 9 over the metal conductor lines 101 on the layer of semiconductor impedance thermal material 10 with contact portions 7 of the metal conductor lines 101 exposed to the outside for the connection of lead out wires.

The aforesaid semiconductor impedance thermal material 10 is comprised of 30 wt % thermoplastic resin, 15 wt % semiconductor metal powder, 15 wt % water glass, 18 wt % nanostructured ceramic powder, and a metal mixture to make 100 wt %, which metal mixture containing high conductive metal powder, semiconductor metal oxide, and metal carbon powder. The thermoplastic resin is adapted to enhance the surface bonding power of the semiconductor impedance thermal material 10 to the metal conductive medium A. The semiconductor metal power is adapted to enhance the impedance of the semiconductor impedance thermal material 10. The water glass is adapted to evenly distribute the semiconductor metal oxide. The nanostructured ceramic powder is adapted to keep heat energy and to emit far-infrared rays, boosting the temperature rapidly. The use of high conductive metal powder is to improved electrical conductivity of the semiconductor impedance thermal material 10. The metal carbon powder is adapted to balance the impedance effect of the semiconductor impedance thermal material 10.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A semiconductor impedance thermal film processing procedure comprising the steps of:

(1) preparing a high conductive metal conductive medium and removing stains and suspension particles from the surface of said metal conductive medium;

(2) forming a first insulative layer on the surface of said metal conductive medium (3) covering a layer of semiconductor impedance thermal material on said first insulative layer;

(4) baking said metal conductive medium at 350° C. continuously for 30 minutes and then cooling down said metal conductive medium so as to let said layer of semiconductor impedance thermal material be fixedly bonded to said first insulative layer;

(5) printing metal conductor lines on the surface of said layer of semiconductor impedance thermal material, and then baking said metal conductive medium at 350° C. continuously for 30 minutes, and then cooling down said metal conductive medium so as to let said metal conductor lines be fixedly bonded to said layer of semiconductor impedance thermal material;

(7) covering said metal conductor lines and said layer of semiconductor impedance thermal material with a layer of heat resisting paint containing ceramic powder by means, leaving a part of each said metal conductor line exposed to the outside for the connection of a respective lead out wire; and (8) baking said metal conductive medium at 450° C. continuously for 30 minutes and then cooling down said metal conductive medium so as to form a second insulative layer on said layer of semiconductor impedance thermal material.

2. The semiconductor impedance thermal film processing procedure as claimed in claim 1, wherein said first insulative layer is formed by means of covering the surface of said metal conductive medium with a layer of heat resisting paint containing ceramic powder and then baking said metal conductive medium at 400° C. continuously for 30 minutes and then cooling down said metal conductive medium.

3. The semiconductor impedance thermal film processing procedure as claimed in claim 1, wherein said first insulative layer is formed of heat resisting material on said metal conductive medium by printing.

4. The semiconductor impedance thermal film processing procedure as claimed in claim 1, wherein stains and suspension particles are removed from said metal conductive medium by means of rinsing the surface of said metal conductive medium with clean water.

5. The semiconductor impedance thermal film processing procedure as claimed in claim 1, wherein said first insulative layer is formed by means of employing a low temperature electrolytic cation oxidation process to said metal conductive medium to form an oxide-film on the surface of said metal conductive medium.

6. The semiconductor impedance thermal film processing procedure as claimed in claim 5, wherein said semiconductor impedance thermal material is comprised of 30 wt % thermoplastic resin, 15 wt % semiconductor metal powder, 15 wt % water glass, 18 wt % nanostructured ceramic powder, and a metal mixture to make 100 wt %, said metal mixture containing high conductive metal powder, semiconductor metal oxide, and metal carbon powder.

7. The semiconductor impedance thermal film processing procedure as claimed in claim 5, wherein said oxide-film insulator processing procedure includes the steps of degreasing process, chemical surface grinding process, rinsing, neutralization process, low temperature electrolytic cation oxidation process, secondary rinsing, sealing process, hot water dipping process, and baking.

8. The semiconductor impedance thermal film processing procedure as claimed in claim 5, wherein stains and suspension particles are removed from said metal conductive medium by sand blasting.

* * * * *